United States Patent
Ho et al.

(10) Patent No.: US 9,425,134 B2
(45) Date of Patent: *Aug. 23, 2016

(54) CHIP PACKAGE

(71) Applicant: XINTEC INC., Jhongli, Taoyuan County (TW)

(72) Inventors: Yen-Shih Ho, Kaohsiung (TW); Tsang-Yu Liu, Zhubei (TW); Shu-Ming Chang, New Taipei (TW); Yu-Lung Huang, Daxi Township (TW); Chao-Yen Lin, New Taipei (TW); Wei-Luen Suen, New Taipei (TW); Chien-Hui Chen, Zhongli (TW)

(73) Assignee: XINTEC INC., Taoyuan (TW)

(*) Notice: Subject to any disclaimer, the term of this patent is extended or adjusted under 35 U.S.C. 154(b) by 0 days.

This patent is subject to a terminal disclaimer.

(21) Appl. No.: 14/339,323

(22) Filed: Jul. 23, 2014

(65) Prior Publication Data

US 2014/0332968 A1    Nov. 13, 2014

Related U.S. Application Data

(63) Continuation-in-part of application No. 13/950,101, filed on Jul. 24, 2013, which is a continuation-in-part of application No. 13/105,775, filed on May 11, 2011, now Pat. No. 8,507,321.

(60) Provisional application No. 62/002,774, filed on May 23, 2014, provisional application No. 61/333,459, filed on May 11, 2010.

(51) Int. Cl.
*H01L 23/498* (2006.01)
*H01L 23/31* (2006.01)
(Continued)

(52) U.S. Cl.
CPC ...... *H01L 23/49805* (2013.01); *G06K 9/00006* (2013.01); *G06K 9/00053* (2013.01);
(Continued)

(58) Field of Classification Search
USPC .............. 257/81, 99, 414, 503, 688, 773; 361/772–776; 438/48, 107, 125, 414, 438/460
See application file for complete search history.

(56) References Cited

U.S. PATENT DOCUMENTS 5,478,781 A    12/1995   Bertin et al.
7,012,334 B2 *  3/2006   Liu et al. .................. 257/737
(Continued)

FOREIGN PATENT DOCUMENTS

CN    102244047    11/2011
CN    103107153    5/2013
(Continued)

Primary Examiner — Michelle Mandala
(74) Attorney, Agent, or Firm — Liu & Liu

(57) ABSTRACT

A chip package is provided. The chip package includes a chip having an upper surface, a lower surface and a sidewall. The chip includes a sensing region or device region and a signal pad region adjacent to the upper surface. A shallow recess structure is located outside of the signal pad region and extends from the upper surface toward the lower surface along the sidewall. The shallow recess structure has at least a first recess and a second recess under the first recess. A redistribution layer is electrically connected to the signal pad region and extends into the shallow recess structure. A first end of a wire is located in the shallow recess structure and is electrically connected to the redistribution layer. A second end of the wire is used for external electrical connection. A method for forming the chip package is also provided.

21 Claims, 6 Drawing Sheets

(51) Int. Cl.
    *H01L 21/56*     (2006.01)
    *H01L 23/00*     (2006.01)
    *G06K 9/00*     (2006.01)
    *H01L 25/065*     (2006.01)
    *H01L 23/525*     (2006.01)
    *H01L 23/532*     (2006.01)

(52) U.S. Cl.
CPC .......... *H01L21/561* (2013.01); *H01L 23/3121* (2013.01); *H01L 24/05* (2013.01); *H01L 25/0657* (2013.01); *H01L 23/3135* (2013.01); *H01L 23/3192* (2013.01); *H01L 23/525* (2013.01); *H01L 23/5329* (2013.01); *H01L 24/32* (2013.01); *H01L 24/45* (2013.01); *H01L 24/48* (2013.01); *H01L 24/73* (2013.01); *H01L 2224/024* (2013.01); *H01L 2224/02381* (2013.01); *H01L 2224/04042* (2013.01); *H01L 2224/0569* (2013.01); *H01L 2224/05548* (2013.01); *H01L 2224/05558* (2013.01); *H01L 2224/05567* (2013.01); *H01L 2224/05572* (2013.01); *H01L 2224/05611* (2013.01); *H01L 2224/05624* (2013.01); *H01L 2224/05644* (2013.01); *H01L 2224/05647* (2013.01); *H01L 2224/05655* (2013.01); *H01L 2224/05669* (2013.01); *H01L 2224/05687* (2013.01); *H01L 2224/32145* (2013.01); *H01L 2224/32225* (2013.01); *H01L 2224/45144* (2013.01); *H01L 2224/4869* (2013.01); *H01L 2224/48091* (2013.01); *H01L 2224/48145* (2013.01); *H01L 2224/48227* (2013.01); *H01L 2224/48611* (2013.01); *H01L 2224/48624* (2013.01); *H01L 2224/48644* (2013.01); *H01L 2224/48647* (2013.01); *H01L 2224/48655* (2013.01); *H01L 2224/48669* (2013.01); *H01L 2224/48687* (2013.01); *H01L 2224/73265* (2013.01); *H01L 2224/94* (2013.01); *H01L 2924/00014* (2013.01); *H01L 2924/10253* (2013.01); *H01L 2924/12041* (2013.01); *H01L 2924/14* (2013.01); *H01L 2924/1461* (2013.01)

(56) References Cited

U.S. PATENT DOCUMENTS

| | | | | |
|---|---|---|---|---|
| 7,199,345 | B1* | 4/2007 | Meisel et al. | 250/207 |
| 8,089,142 | B2* | 1/2012 | Brooks | 257/686 |
| 8,736,080 | B2 | 5/2014 | Arnold et al. | |
| 8,952,501 | B2 | 2/2015 | Huang et al. | |
| 2008/0030207 | A1 | 2/2008 | Vermesan et al. | |
| 2008/0096321 | A1 | 4/2008 | Lin et al. | |
| 2008/0315407 | A1 | 12/2008 | Andrews, Jr. et al. | |
| 2011/0156238 | A1* | 6/2011 | Hsu et al. | 257/692 |
| 2011/0198732 | A1* | 8/2011 | Lin et al. | 257/621 |
| 2011/0241216 | A1* | 10/2011 | Tada et al. | 257/773 |
| 2011/0278724 | A1 | 11/2011 | Lin et al. | |
| 2012/0001286 | A1* | 1/2012 | Yoon | 257/432 |
| 2013/0285240 | A1 | 10/2013 | Last et al. | |
| 2013/0307125 | A1* | 11/2013 | Huang et al. | 257/623 |
| 2013/0343022 | A1 | 12/2013 | Hu et al. | |

FOREIGN PATENT DOCUMENTS

| | | |
|---|---|---|
| JP | 2002-151546 | 5/2002 |
| JP | 2004-363400 | 12/2004 |
| TW | 201140779 | 11/2011 |

\* cited by examiner

CHIP PACKAGE

CROSS REFERENCE TO RELATED APPLICATIONS

This Application claims the benefit of U.S. Provisional Application No. 62/002,774, filed May 23, 2014 and is a Continuation-In-Part of U.S. patent application Ser. No. 13/950,101, filed Jul. 24, 2013, which is a Continuation-In-Part of U.S. Pat. No. 8,507,321, filed May 11, 2011, which claims the benefit of U.S. Provisional Application No. 61/333,459, filed May 11, 2010, the entirety of which are incorporated by reference herein.

BACKGROUND OF THE INVENTION

1. Field of the Invention

The invention relates to chip-package technology, and in particular to a chip package and methods for forming the same.

2. Description of the Related Art

The chip packaging process is an important step during the fabrication of an electronic product. Chip packages not only protect the chips therein from outer environmental contaminants, but also provide electrical connection paths between electronic elements inside and outside of the chip packages.

A conventional chip package having sensing functions, such as a fingerprint-recognition chip package shown in FIG. 4, is formed by disposing a fingerprint-recognition chip 520 on a printed circuit board 510. Wires 530 are bonded from a contact pad region on an upper surface of the chip 520 to the printed circuit board 510. The fingerprint-recognition chip 520 is then covered by an encapsulant layer 540. The thickness of the encapsulant layer 540 cannot be reduced due to the height of the wires 530 protruding from the upper surface of the chip 520. In order to prevent the sensitivity of the sensing region 523 from being affected by the thick encapsulant layer 540, the side height of the periphery of the packaged fingerprint-recognition chip 520 is higher than that of the sensing region 523 in the center thereof, and therefore a flat surface cannot be formed. In addition, since the wires 530 are adjacent to the edges of the fingerprint-recognition chip 520, they easily contact the chip edges during the bonding process which may result in a short circuit or a broken circuit, thereby reducing the yield.

Thus, there exists a need in the art for development of a chip package and methods for forming the same capable of reducing the thickness of the encapsulant layer thereby improving the sensitivity of the chip package and providing a chip package having a flat contacting surface.

BRIEF SUMMARY OF THE INVENTION

An embodiment of the invention provides a chip package comprising a chip having an upper surface, a lower surface and a sidewall. The chip comprises a sensing region or device region and a signal pad region adjacent to the upper surface. A shallow recess structure is located outside of the signal pad region and extends from the upper surface toward the lower surface along the sidewall. The shallow recess structure has at least a first recess and a second recess under the first recess. A redistribution layer is electrically connected to the signal pad region and extends into the shallow recess structure. A wire has a first end and a second end, wherein the first end is disposed in the shallow recess structure and is electrically connected to the redistribution layer, and the second end is used for external electrical connection.

An embodiment of the invention provides a method for forming a chip package comprising providing a wafer having a plurality of chips. Each chip has an upper surface and a lower surface and comprises a sensing region or device region and a signal pad region adjacent to the upper surface. A shallow recess structure is formed outside of the signal pad region in each chip and extends from the upper surface toward the lower surface. The shallow recess structure has at least a first recess and a second recess under the first recess. A redistribution layer is formed in each chip, electrically connected to the signal pad region, and extends into the shallow recess structure. The wafer is diced to separate the plurality of chips, such that each chip has a sidewall and the shallow recess structure extends along the sidewall. A wire having a first end and a second end is bonded to each chip. The first end is located in the shallow recess structure and is electrically connected to the redistribution layer. The second end is used for external electrical connection.

An embodiment of the invention provides a chip package comprising a chip having an upper surface, a lower surface and a sidewall. The chip comprises a sensing region or device region and a signal pad region adjacent to the upper surface. A shallow recess structure is located outside of the signal pad region and extends from the upper surface toward the lower surface along the sidewall. The shallow recess structure has at least a first recess and a second recess under the first recess. A redistribution layer is electrically connected to the signal pad region and extends into the shallow recess structure. A wire has a first end and a second end, wherein the first end is disposed in the shallow recess structure and is electrically connected to the redistribution layer, and the second end is used for external electrical connection. The chip comprises a semiconductor substrate and an insulating layer. A first sidewall of the first recess adjoins the insulating layer and a second sidewall of the second recess adjoins the semiconductor substrate. A first bottom of the first recess exposes a surface of the semiconductor substrate. An encapsulant layer at least covers the wire.

An embodiment of the invention provides a chip package comprising a chip having an upper surface, a lower surface and a sidewall. The chip comprises a sensing region or device region and a signal pad region adjacent to the upper surface. A shallow recess structure is located outside of the signal pad region and extends from the upper surface toward the lower surface along the sidewall. The shallow recess structure has at least a first recess and a second recess under the first recess. A redistribution layer is electrically connected to the signal pad region and extends into the shallow recess structure. A wire has a first end and a second end, wherein the first end is disposed in the shallow recess structure and is electrically connected to the redistribution layer, and the second end is used for external electrical connection. A first bottom of the first recess has a lateral width that is narrower than that of a second bottom of the second recess. An encapsulant layer at least covers the wire.

An embodiment of the invention provides a chip package comprising a chip having an upper surface, a lower surface and a sidewall. The chip comprises a sensing region or device region and a signal pad region adjacent to the upper surface. A shallow recess structure is located outside of the signal pad region and extends from the upper surface toward the lower surface along the sidewall. The shallow recess structure has at least a first recess and a second recess under the first recess. A redistribution layer is electrically connected to the signal pad region and extends into the shallow recess structure. A wire has a first end and a second end, wherein the first end is disposed in the shallow recess structure and is electrically connected to the redistribution layer, and the second end is used for external electrical connection. The chip comprises a semiconductor substrate and an insulating layer. A first sidewall of the first recess adjoins the insulating layer and a second sidewall of the second recess adjoins the semiconductor substrate. A portion of the wire is higher than the upper surface of the chip. An encapsulant layer at least covers the wire.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, capacitance, pressure, and so on. In particular, a wafer-level package (WSP) process may optionally be used to package semiconductor chips, such as image-sensor elements, light-emitting diodes (LEDs), solar cells, RF circuits, accelerators, gyroscopes, microactuators, surface acoustic wave devices, pressure sensors, ink printer heads, and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 1A:
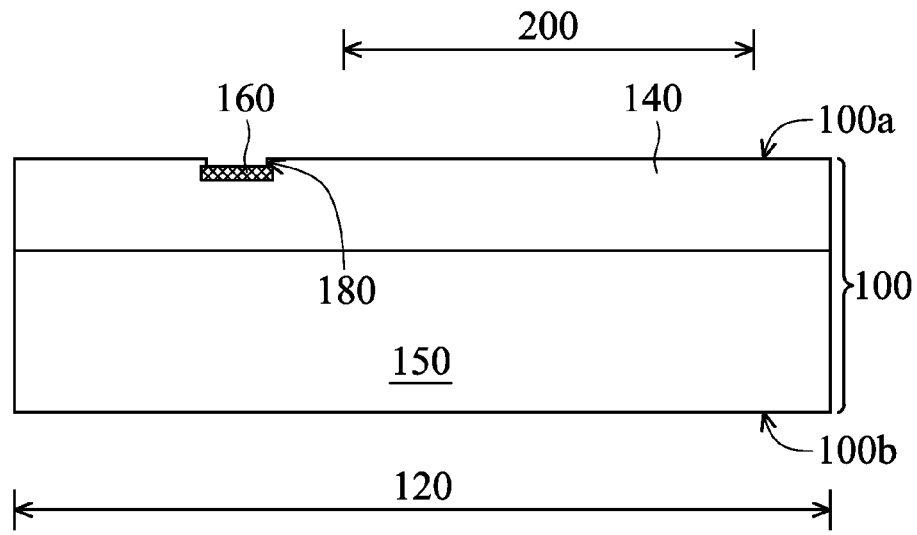
FIGS. 1A-1F are cross-sectional views of an exemplary embodiment of a method for forming a chip package according to the invention.
Figure 1B:
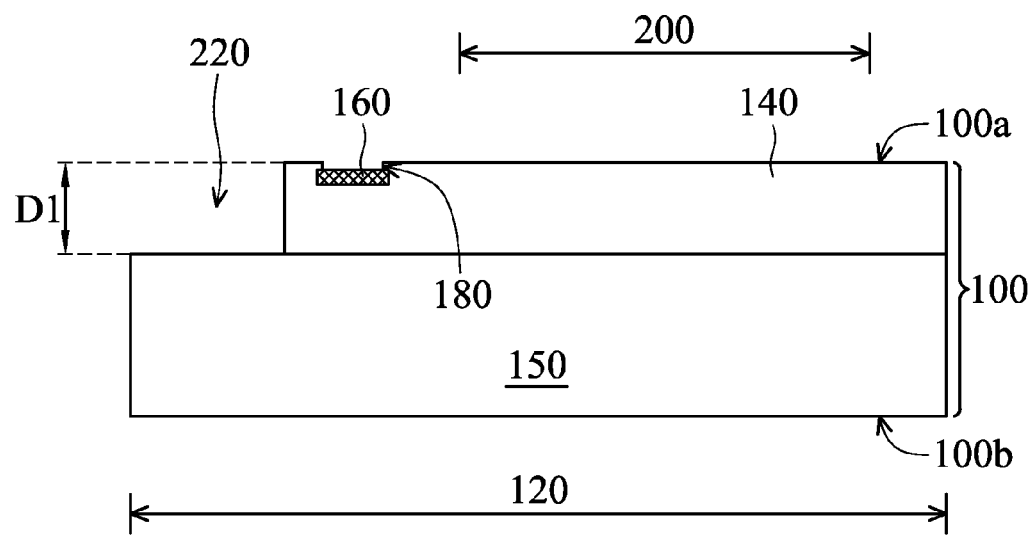
Figure 1C:
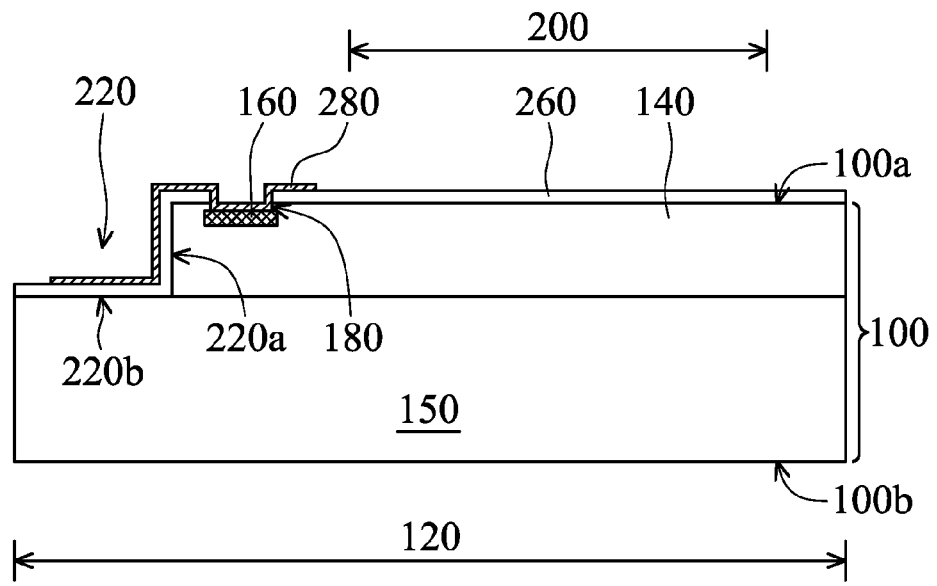
Figure 1D:
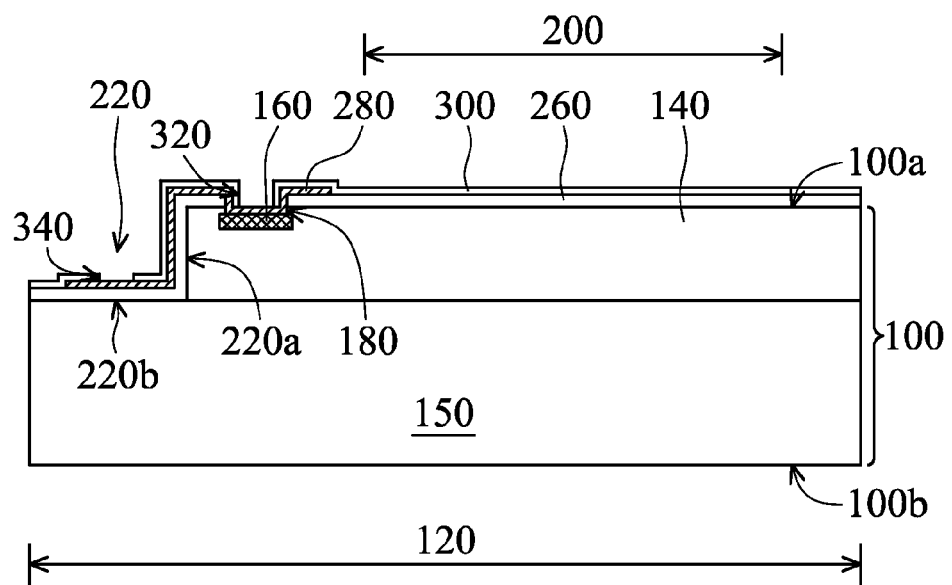
Figure 1E:
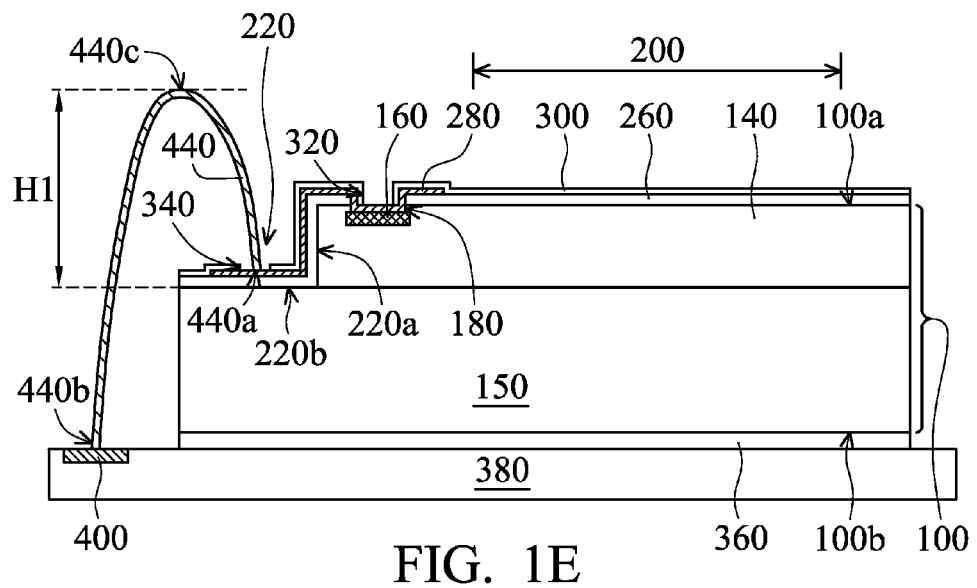
Figure 1F:
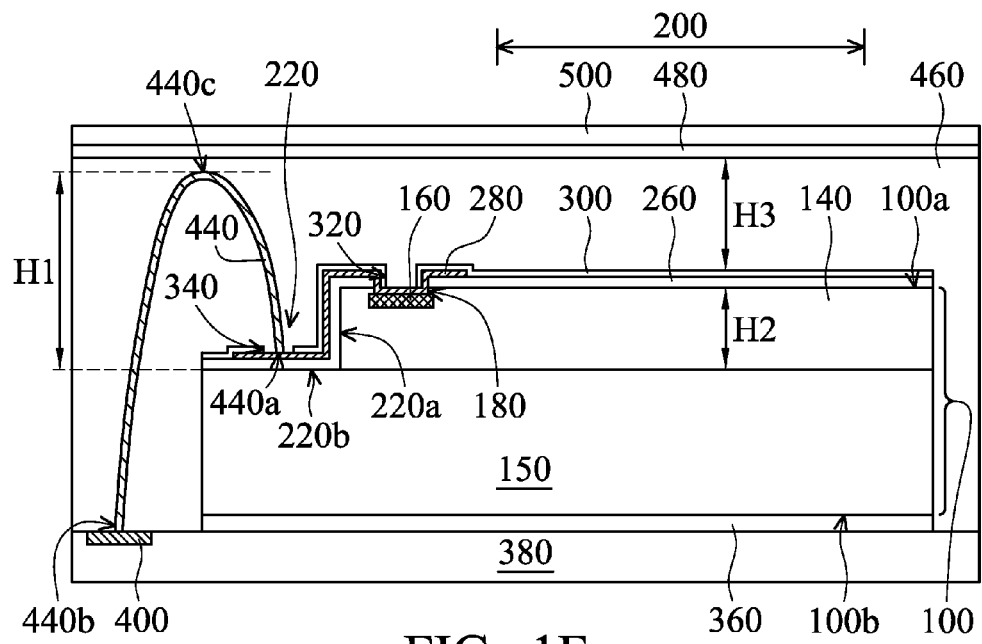

Referring to FIG. 1F, a cross-sectional view of an exemplary embodiment of a chip package according to the invention is illustrated. In the embodiment, the chip package comprises a chip 100, a shallow recess structure, an external component 380 and a wire 440. The chip 100 has an upper surface 100a and a lower surface 100b. In one embodiment, the chip 100 comprises an insulating layer 140 adjacent to the upper surface 100a and an underlying substrate 150. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In the embodiment, the chip 100 comprises a signal pad region 160 and a sensing region or device region 200 which may be adjacent to the upper surface 100a. In one embodiment, the signal pad region 160 comprises a plurality of conducting pads and each conducting pad may be a single conducting layer or comprise multiple conducting layers. To simplify the diagram, only one conducting pad formed of a single conducting layer in the insulating layer 140 is depicted herein as an example. In the embodiment, the insulating layer 140 may comprise one or more openings 180 exposing the respective conducting pads.

In one embodiment, the sensing region or device region 200 of the chip 100 comprises a sensing component, such as a biometric sensing chip, which may be used for sensing biometric features. In another embodiment, the chip 100 is used for sensing environmental features. For example, the chip 100 may comprise a temperature-sensing component, a humidity-sensing component, a pressure-sensing component, a capacitance-sensing component or another suitable sensing component. In yet another embodiment, the chip 100 may comprise an image-sensing component. In one embodiment, the sensing component in the chip 100 may be electrically connected to the conducting pads by an interconnection structure in the insulating layer 140.

In one embodiment, the shallow recess structure is formed of a first recess 220 outside of the signal pad region 160 and extending from the upper surface 100a toward the lower surface 100b along the sidewall of the chip 100. The first recess 220 has a first sidewall 220a and a first bottom 220b. In one embodiment, the first sidewall 220a of the first recess 220 adjoins the insulating layer 140, and the first bottom 220b of the first recess 220 exposes a surface of the underlying substrate 150. In the embodiment, the first recess 220 has a depth D1 (shown in FIG. 1B) no greater than 15 μm. In one embodiment, the first recess 220 is formed by etching the insulating layer 140 and has a first sidewall 220a substantially perpendicular to the upper surface 100a. For example, the angle between the first sidewall 220a of the first recess 220 and the upper surface 100a may be in a range of about 84° to about 90°. In addition, in another embodiment, the first recess 220 is formed by dicing the insulating layer 140 and the angle between the first sidewall 220a of the first recess 220 and the upper surface 100a may be in a range of about 55° to about 90°.

In one embodiment, an optional insulating layer 260 may be conformally disposed on the upper surface 100a of the chip 100, extend to the first sidewall 220a and the first bottom 220b of the first recess 220, and expose a portion of the signal pad region 160. In the embodiment, the insulating layer 260 may comprise inorganic materials, such as silicon oxide, silicon nitride, silicon oxynitride, metal oxide, a combination thereof, or another suitable insulating material.

A patterned redistribution layer (RDL) 280 conformally extends into the opening 180 and onto the first sidewall 220a and the first bottom 220b of the first recess 220. The redistribution layer 280 may be electrically connected to the signal pad region 160 through the opening 180. In one embodiment, the redistribution layer 280 is disposed on the insulating layer 260 and therefore it can be prevented from electrically contacting the substrate 150. In one embodiment, the redistribution layer 280 may comprise copper, aluminum, gold, platinum, nickel, tin, a combination thereof, conductive polymer materials, conductive ceramic materials, such as indium tin oxide or indium zinc oxide, or another suitable conducting material.

A protection layer 300 is conformally disposed on the redistribution layer 280 and the insulating layer 260 and extends into the first recess 220. The protection layer 300 comprises one or more openings exposing a portion of the redistribution layer 280. In the embodiment, the protection layer 300 comprises openings 320 and 340 respectively exposing the redistribution layer 280 on the signal pad region 160 and in the first recess 220. In other embodiments, the protection layer 300 may merely comprise the opening 340, for example, the opening 320 on the signal pad region 160 is covered. In the embodiment, the protection layer 300 may comprise inorganic materials, such as silicon oxide, silicon nitride, silicon oxynitride, metal oxide, a combination thereof, or another suitable insulating material.

The external component 380 may be a substrate and be attached onto the lower surface 100b of the chip 100 by an adhesive layer (such as a glue) 360. In the embodiment, the external component 380 may be a circuit board, a chip or an interposer. Taking the circuit board as an example, it may have one or more contact pad regions 400 on a surface thereof.

The wire 440 has a first end 440a and a second end 440b, wherein the first end 440a is in the shallow recess structure and electrically connected to the redistribution layer 280, the second end 440b is used for external electrical connection and a portion of the wire 440 protrudes from the upper surface 100a of the chip 100. For example, the wire 440 may be electrically connected to the contact pad region 400 of the circuit board 380 by the second end 440b, and be electrically connected to the redistribution layer 280 on the first bottom 220b of the first recess 220 by the first end 440a, wherein the highest portion 440c of the wire 440 protrudes from the upper surface 100a of the chip 100. In the embodiment, although taking that a portion of the wire 440 protrudes from the upper surface 100a as an example, it is not limited thereto. In other embodiments, the wire 440 may be lower than the upper surface 100a through the shallow recess structure.

In the embodiment, the chip package may further comprise an encapsulant layer 460 optionally covering the wire 440 and the shallow recess structure, or it may further extend onto the upper surface 100a of the chip 100 to form a flat contacting surface above the sensing region or device region 200. The encapsulant layer 460 is generally formed of molding materials or sealing materials.

In one embodiment, a decorative layer 480 may additionally be disposed on the encapsulant layer 460 and may have colors according to design demands to show regions having sensing functions. A protection layer (such as sapphire substrate or hard rubber) 500 may be additionally disposed on the decorative layer 480 to further provide an abrasion-resistant, scrape-proof and high-reliability surface, thereby preventing the sensing device from being contaminated or damaged while the sensing functions of the chip package are being executed.

According to the aforementioned embodiments, a distance H1 is defined from the highest portion 440c of the wire 440 to the bottom of the shallow recess structure (i.e., the first bottom 220b of the first recess 220). The shallow recess structure has a depth H2 (i.e., the depth D1 of the first recess 220). The encapsulant layer 460 covering the sensing region or device region 200 has a thickness H3 determined by the difference between the distance H1 from the highest portion 440c of the wire 440 to the bottom of the shallow recess structure and the depth H2 of the shallow recess structure (i.e., H1−H2). Therefore, the thickness H3 of the encapsulant layer 460 covering the sensing region or device region 200 can be reduced by adjusting the depth H2 of the shallow recess structure, such that the sensitivity of the sensing region is increased and a flat contacting surface is formed. In addition, since the shallow recess structure is formed without removing too much substrate material, the structural strength of the substrate can be maintained.

Figure 2:
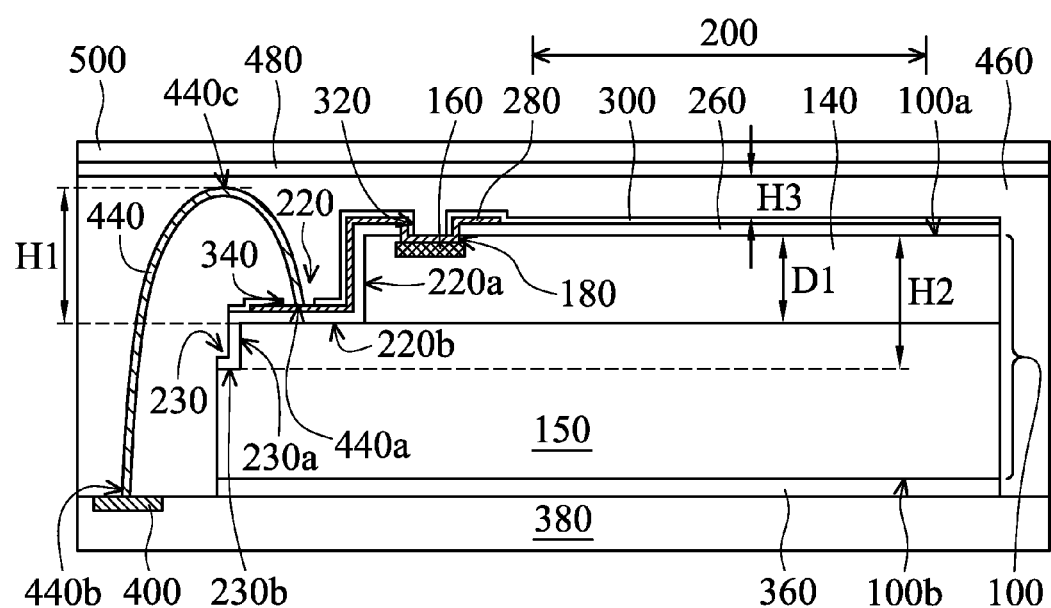
FIGS. 2 to 3 are cross-sectional views of various exemplary embodiments of a chip package according to the invention.
Figure 3:
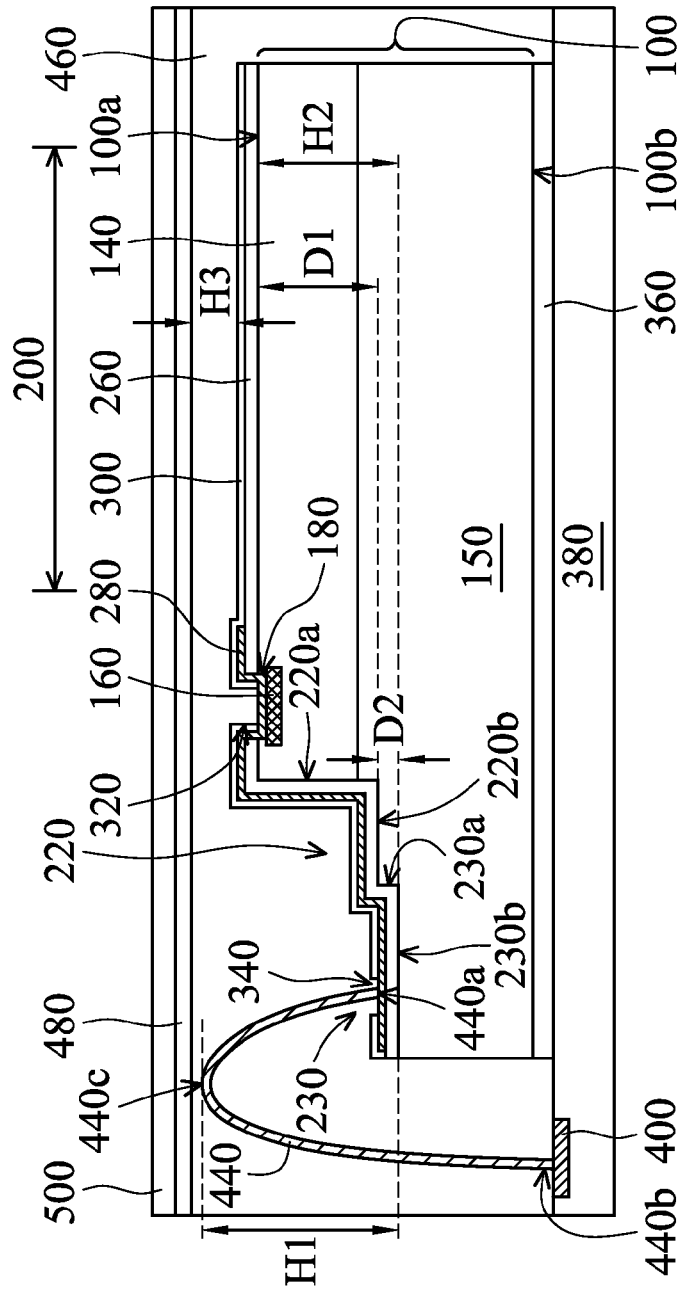
Figure 4:
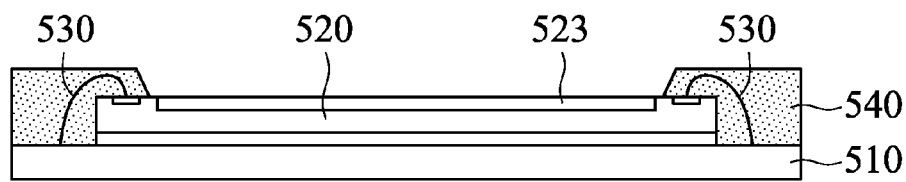
FIG. 4 is a cross-sectional view of a conventional chip package.

Referring to FIGS. 2 and 3, cross-sectional views of various exemplary embodiments of a chip package according to the invention are illustrated, wherein elements in FIGS. 2 and 3 that are the same as those in FIG. 1F are labeled with the same reference numbers as in FIG. 1F and are not described again for brevity. The chip package structure shown in FIG. 2 is similar to that shown in FIG. 1F. The difference therebetween is that the chip package structure shown in FIG. 2 further comprises a second recess 230 extending from the first bottom 220b of the first recess 220 toward the lower surface 100b. The second recess 230 has a second sidewall 230a and a second bottom 230b, wherein the second sidewall 230a of the second recess 230 adjoins the substrate 150. The underlying second recess 230 has a lateral width that is narrower than that of the overlying first recess 220. In the embodiment, the insulating layer 260 extends to the second sidewall 230a and the second bottom 230b of the second recess 230.

In the embodiment, a distance H1 is defined from the highest portion 440c of the wire 440 to the first bottom 220b of the first recess 220. The encapsulant layer 460 covering the sensing region or device region 200 has a thickness H3 determined by the difference between the distance H1 from the highest portion 440c of the wire 440 to the bottom of the shallow recess structure and the depth D1 of the first recess 220 (i.e., H1−D1).

In the embodiment, the first end 440a of the wire 440 is in electrical contact with the redistribution layer 280 on the first bottom 220b of the overlying first recess 220. Accordingly, the maximum height of the wire 440 can be reduced further. Furthermore, since the space between the wire 440 and the first bottom 220b of the first recess 220 is increased by the second recess 230, the possibility of the wire coming into contact with the edge of the first recess 220, resulting in a short circuit or a broken circuit, can be also reduced.

The chip package structure shown in FIG. 3 is similar to that shown in FIG. 2. The difference therebetween is that the underlying second recess 230 shown in FIG. 3 has a lateral width that is wider than that of the overlying first recess 220. Furthermore, the redistribution layer 280 further extends to the second sidewall 230a and the second bottom 230b of the underlying second recess 230 and the first end 440a of the wire 440 electrically contacts the redistribution layer 280 on the second bottom 230b of the underlying second recess 230 through the opening 340. In addition, the overlying first recess 220 penetrates through the insulating layer 140 and may further extend into the underlying substrate 150, such that the first sidewall 220a may adjoin the insulating layer 140 and a portion of the underlying substrate 150.

In the embodiment, a distance H1 is defined from the highest portion 440c of the wire 440 to the bottom of the shallow recess structure (i.e., the second bottom 230b of the second recess 230). The shallow recess structure has a depth H2 which is the combined depth of the first recess 220 and the second recess 230 (i.e., D1+D2). The encapsulant layer 460 covering the sensing region or device region 200 has a thickness H3 determined by the difference between the distance H1 from the highest portion 440c of the wire 440 to the bottom of the shallow recess structure and the depth H2 of the shallow recess structure (i.e., H1-H2).

In the embodiment, the second recess 230 further extends into the substrate 150 and therefore the highest height of the wire 440 can be reduced further while the structural strength of the substrate can still be maintained. Undercutting at an interface between the insulating layer 140 and the substrate 150, which may result in over-etching by directly extending the first recess 220 downward, can be prevented.

In other embodiments, the second end 440b of the wire 440 is an initial end for wire bonding and the first end 440a is subsequently formed on the redistribution layer 280.

An exemplary embodiment of a method for forming a chip package according to the invention is illustrated with FIGS. 1A to 1F, wherein FIGS. 1A to 1F are cross-sectional views of an exemplary embodiment of a method for forming a chip package according to the invention.

Referring to FIG. 1A, a wafer having chip regions 120 is provided. The chip regions 120 comprise a plurality of chips 100. Each chip 100 has an upper surface 100a and a lower surface 100b. In one embodiment, the chip 100 comprises a substrate 150 and an insulating layer 140 adjacent to the upper surface 100a. In general, the insulating layer 140 may comprise an interlayer dielectric (ILD), an inter-metal dielectric (IMD) and a passivation layer. In the embodiment, the insulating layer 140 may comprise inorganic materials, such as silicon oxide, silicon nitride, silicon oxynitride, metal oxide, a combination thereof, or another suitable insulating material. In the embodiment, the substrate 150 may comprise silicon or another semiconductor material.

In the embodiment, each chip 100 comprises one or more signal pad regions 160 which may be adjacent to the upper surface 100a, and comprises a plurality of conducting pads. To simplify the diagram, only one chip region 120 and one conducting pad in the insulating layer 140 are depicted as an example. In one embodiment, the conducting pad may be a single conducting layer or comprise multiple conducting layers. Herein, a single conducting layer is illustrated as an example. In the embodiment, the insulating layer 140 may comprise one or more openings 180 exposing the respective conducting pads.

In the embodiment, each chip 100 comprises a sensing region or device region 200 which may be adjacent to the upper surface 100a. In one embodiment, the sensing region or device region 200 is used for sensing biometric features. For example, the sensing region or device region 200 can comprise a fingerprint-recognition component. In another embodiment, the sensing region or device region 200 is used for sensing environmental features, and may comprise a temperature-sensing component, a humidity-sensing component, a pressure-sensing component, a capacitance-sensing component or another suitable sensing component. In yet another embodiment, the sensing region or device region 200 may comprise an image-sensing component. In one embodiment, the sensing component in the chip 100 may be electrically connected to the conducting pads by an interconnection structure in the insulating layer 140.

Referring to FIG. 1B, a shallow recess structure may be formed in each chip 100 by lithography and etching processes (the etching process may comprise a dry etching process, a wet etching process, a plasma etching process, a reactive ion etching process or another suitable process). For example, a first recess 220 is formed in the insulating layer 140, extends from the upper surface 100a toward the lower surface 100b along a scribe line (not shown), and then penetrates the insulating layer 140 to expose the underlying substrate 150. Namely, the first recess 220 has a depth nearly equal to or slightly deeper than the thickness of the insulating layer 140. In the embodiment, the depth D1 of the first recess 220 is no greater than 15 μm. In one embodiment, the first recess 220 formed by an etching process has a first sidewall 220a substantially perpendicular to the upper surface 100a. For example, the angle between the first sidewall 220a of the first recess 220 and the upper surface 100a may be in a range of about 84° to about 90°. In another embodiment, the first recess 220 is formed by a dicing process and the first sidewall 220a is substantially inclined to the upper surface 100a. For example, the angle between the first sidewall 220a of the first recess 220 and the upper surface 100a may be in a range of about 55° to about 90°.

Referring to FIG. 1C, an insulating layer 260 may be conformally formed on the upper surface 100a of the chip 100 by a deposition process (such as a coating process, a chemical vapor deposition process, a physical vapor deposition process or another suitable process) and extend to the opening 180 of the insulating layer 140 and the first recess 220. In the embodiment, the insulating layer 260 may comprise inorganic materials, such as silicon oxide, silicon nitride, silicon oxynitride, metal oxide, a combination thereof, or another suitable insulating material.

Next, the insulating layer 260 in the opening 180 is removed by lithography and etching processes (the etching process may comprise a dry etching process, a wet etching process, a plasma etching process, a reactive ion etching process or another suitable process) to expose a portion of the signal pad region 160. Next, a patterned redistribution layer 280 is formed on the insulating layer 260 by a deposition process (such as a coating process, a chemical vapor deposition process, a physical vapor deposition process, an electroplating process, an electroless plating process or another suitable process) and lithography and etching processes.

The redistribution layer 280 conformally extends into the opening 180 and onto the first sidewall 220a and the first bottom 220b of the first recess 220, and is electrically connected to the exposed signal pad region 160 through the opening 180. In one embodiment, the redistribution layer 280 does not reach the edge of the first bottom 220b of the first recess 220. Moreover, when the substrate 150 comprises a semiconductor material, the redistribution layer 280 can be electrically insulated by the insulating layer 260. In one embodiment, the redistribution layer 280 may comprise copper, aluminum, gold, platinum, nickel, tin, a combination thereof, conductive polymer materials, conductive ceramic materials (such as indium tin oxide or indium zinc oxide) or another suitable conducting material.

Referring to FIG. 1D, a protection layer 300 may be conformally formed on the redistribution layer 280 and the insulating layer 260 by a deposition process (such as a coating process, a chemical vapor deposition process, a physical vapor deposition process or another suitable process) and extend into the first recess 220. In the embodiment, the protection layer 300 may comprise inorganic materials, such as silicon oxide, silicon nitride, silicon oxynitride, metal oxide, a combination thereof, or another suitable insulating material.

Next, one or more openings may be formed in the protection layer 300 by lithography and etching processes (the etching process may comprise a dry etching process, a wet etching process, a plasma etching process, a reactive ion etching process or another suitable process) to expose a portion of the redistribution layer 280. In the embodiment, openings 320 and 340 are formed in the protection layer 300 to respectively expose the redistribution layer 280 in the opening 180 and the first recess 220.

In other embodiments, only the opening 340 may be formed in the protection layer 300. It should be realized that the number and position of the opening in the protection layer 300 are determined by design demands and it is not limited thereto.

Next, a dicing process is performed in the wafer along the scribe lines (not shown) to form a plurality of independent chips 100. After performing the dicing process, the first recess 220 of each chip 100 extends from the upper surface 100a toward the lower surface 100b along a sidewall of the chip 100.

Next, referring to FIG. 1E, an external component 380 may be attached onto the lower surface 100b of the substrate 150 of the independent chip 100 by an adhesive layer (such as a glue) 360. In the embodiment, the external component 380 may be a circuit board, a chip or an interposer. Taking the circuit board as an example, the external component 380 may comprise one or more contact pad regions 400. Similarly, the contact pad region 400 may comprise a plurality of conducting pad which may be a single conducting layer or comprise multiple conducting layers. To simplify the diagram, only one contact pad region 400 formed of a single conducting layer is depicted herein as an example.

Next, a wire 440 having an second end 440b to be initially formed on the contact pad region 400 of the external component 380 and having a first end 440a electrically connected to the redistribution layer 280 on the first bottom 220b of the first recess 220 is formed by a wire bonding process. In the embodiment, the wire 440 comprises the highest portion 440c having a distance H1 between the highest portion 440c and the first bottom 220b of the first recess 220. In the embodiment, the wire 440 may comprise gold or another suitable conducting material.

In another embodiment, as shown in FIG. 2, a portion of the substrate 150 is removed by an etching or dicing process to form a second recess 230 extending from the first bottom 220b of the first recess 220 toward the lower surface 100b. The second recess 230 has a second sidewall 230a and a second bottom 230b, wherein the second sidewall 230a of the second recess 230 adjoins the substrate 150 and the underlying second recess 230 has a lateral width that is narrower than that of the overlying first recess 220. In the embodiment, the insulating layer 260 extends to the second sidewall 230a and the second bottom 230b of the second recess 230.

In the embodiment, the first end 440a of the wire 440 electrically contacts the redistribution layer 280 on the first bottom 220b of the overlying first recess 220. Accordingly, the highest height of the wire 440 can be reduced further. Furthermore, since the space between the wire 440 and the first bottom 220b of the first recess 220 is increased by the second recess 230, the possibility of the wire coming into contact with the edge of the first recess 220, resulting in a short circuit or a broken circuit, can be also reduced In yet another embodiment, the chip package structure shown in FIG. 3 is similar to that shown in FIG. 2. The difference therebetween is that the underlying second recess 230 shown in FIG. 3 has a lateral width that is wider than that of the overlying first recess 220. Furthermore, the redistribution layer 280 further extends to the second sidewall 230a and the second bottom 230b of the underlying second recess 230 but does not reach the edge of the second bottom 230b. The first end 440a of the wire 440 electrically contacts the redistribution layer 280 on the second bottom 230b of the underlying second recess 230 through the opening 340.

In the embodiment, since the second recess 230 further extends into the substrate 150, the highest height of the wire 440 can be reduced further while the structural strength of the substrate can still be maintained. Moreover, undercutting at an interface between the insulating layer 140 and the substrate 150, which results in the over-etching by directly extending downward the first recess 220, can be prevented.

Next, referring to FIG. 1F, an encapsulant layer 460 may be formed on the upper surface 100a of the chip 100 by a molding process or another suitable process. The encapsulant layer 460 may optionally cover the first recess 220, the second recess 230 (as shown in FIG. 2 and FIG. 3), the external component 380 and the wire 440, or it may further extend onto the upper surface 100a of the chip 100 to form a flat contacting surface above the sensing region or device region 200.

Next, a decorative layer 480 may be formed on the encapsulant layer 460 by a deposition process (such as a coating process or another suitable process) and may have colors according to design demands to show regions having sensing functions. Next, a protection layer (such as sapphire substrate or hard rubber) 500 may be formed on the decorative layer 480 by a deposition process (such as a coating process, a physical vapor deposition process, a chemical vapor deposition process or another suitable process) to further provide an abrasion-resistant, scrape-proof and high-reliability surface.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a chip having an upper surface, a lower surface and a sidewall, wherein the chip comprises a sensing region or device region and a signal pad region adjacent to the upper surface;
    a shallow recess structure outside of the signal pad region and extending from the upper surface toward the lower surface along the sidewall, wherein the shallow recess structure has at least a first recess and a second recess under the first recess, and wherein a portion of the sidewall is located under the second recess and a first sidewall of the first recess is longer than a second sidewall of the second recess as viewed from a cross-sectional view;
    a redistribution layer electrically connected to the signal pad region and extending into the shallow recess structure; and
    a wire having a first end and a second end, wherein the first end is disposed in the shallow recess structure and electrically connected to the redistribution layer, and the second end is used for external electrical connection.

2. The chip package as claimed in claim 1, wherein the first recess has a first bottom, and the redistribution layer extends to the first sidewall and the first bottom of the first recess.

3. The chip package as claimed in claim 2, wherein the second recess extends from the first bottom of the first recess toward the lower surface, and the second recess has a second bottom.

4. The chip package as claimed in claim 3, wherein the first bottom has a lateral width wider than that of the second bottom, and the first end of the wire is electrically connected to the redistribution layer on the first bottom.

5. The chip package as claimed in claim 3, wherein the redistribution layer extends from the upper surface of the chip to the second sidewall and the second bottom of the second recess.

6. The chip package as claimed in claim 5, wherein the first bottom has a lateral width narrower than that of the second bottom, and the first end of the wire is electrically connected to the redistribution layer on the second bottom.

7. The chip package as claimed in claim 3, wherein the chip comprises a substrate and an insulating layer, and wherein the first sidewall of the first recess adjoins the insulating layer and a portion of the substrate and the second sidewall of the second recess adjoins the substrate.

8. The chip package as claimed in claim 7, further comprising an encapsulant layer covering the wire and the upper surface to form a flat contacting region above the sensing region or device region, wherein the first bottom has a lateral width wider than that of the second bottom, and the first end of the wire is electrically connected to the redistribution layer on the first bottom, and wherein a highest portion of the wire protrudes from the upper surface of the chip and a thickness of the encapsulant layer covering the sensing region or device region is determined by a difference between a distance from the highest portion of the wire to the first bottom of the first recess and a depth of the first recess.

9. The chip package as claimed in claim 8, wherein the chip is a biometric recognition chip.

10. The chip package as claimed in claim 7, further comprising an encapsulant layer covering the wire and the upper surface to form a flat contacting region above the sensing region or device region, wherein the first bottom has a lateral width narrower than that of the second bottom, the redistribution layer further extends to the second sidewall and the second bottom of the second recess, and the first end of the wire is electrically connected to the redistribution layer on the second bottom, and wherein a highest portion of the wire protrudes from the upper surface of the chip, and a thickness of the encapsulant layer covering the sensing region or device region is determined by a difference between a distance from the highest portion of the wire to the second bottom of the second recess and a depth of the shallow recess structure.

11. The chip package as claimed in claim 10, wherein the chip is a fingerprint-recognition chip.

12. The chip package as claimed in claim 10, wherein the redistribution layer does not reach an edge of the second recess.

13. The chip package as claimed in claim 1, further comprising a protection layer covering the redistribution layer, wherein an opening is formed in the shallow recess structure to provide electrical connection between the first end of the wire and the redistribution layer.

14. The chip package as claimed in claim 13, wherein the signal pad region is covered by the protection layer.

15. The chip package as claimed in claim 1, wherein the second end of the wire is an initial end for wire bonding.

16. The chip package as claimed in claim 1, wherein the redistribution layer does not reach an edge of the shallow recess structure.

17. The chip package as claimed in claim 1, wherein the first end and the second end of the wire are lower than the upper surface of the chip, and a highest portion of the wire protrudes from the upper surface of the chip.

18. The chip package as claimed in claim 17, further comprising an encapsulant layer covering the wire and the upper surface to form a flat contacting region above the sensing region or device region, wherein a thickness of the encapsulant layer covering the sensing region or device region is determined by a difference between a distance from the highest portion of the wire to a bottom of the shallow recess structure and a depth of the shallow recess structure.

19. A chip package, comprising:
a chip having an upper surface, a lower surface and a sidewall, wherein the chip comprises a sensing region or device region and a signal pad region adjacent to the upper surface;
a shallow recess structure outside of the signal pad region and extending from the upper surface toward the lower surface along the sidewall, wherein the shallow recess structure has at least a first recess and a second recess under the first recess;
a redistribution layer electrically connected to the signal pad region and extending into the shallow recess structure;
a wire having a first end and a second end, wherein the first end is disposed in the shallow recess structure and electrically connected to the redistribution layer, and the second end is used for external electrical connection, wherein the chip comprises a semiconductor substrate and an insulating layer, a first sidewall of the first recess adjoins the insulating layer and a second sidewall of the second recess adjoins the semiconductor substrate, wherein a first bottom of the first recess exposes a surface of the semiconductor substrate, and the signal pad region is separated from the semiconductor substrate by the insulating layer; and wherein the first end of the wire is located at the first bottom of the first recess; and
an encapsulant layer at least covering the wire.

20. A chip package, comprising:
a chip having an upper surface, a lower surface and a sidewall, wherein the chip comprises a sensing region or device region and a signal pad region adjacent to the upper surface;
a shallow recess structure outside of the signal pad region and extending from the upper surface toward the lower surface along the sidewall, wherein the shallow recess structure has at least a first recess and a second recess under the first recess;
a redistribution layer electrically connected to the signal pad region and extending into the shallow recess structure;
a wire having a first end and a second end, wherein the first end is disposed in the shallow recess structure and electrically connected to the redistribution layer, and the second end is used for external electrical connection, and wherein the first end of the wire is located at a bottom of the first recess; and
an encapsulant layer at least covering the wire.

21. A chip package, comprising:
a chip having an upper surface, a lower surface and a sidewall, wherein the chip comprises a sensing region or device region and a signal pad region adjacent to the upper surface;
a shallow recess structure outside of the signal pad region and extending from the upper surface toward the lower surface along the sidewall, wherein the shallow recess structure has at least a first recess and a second recess under the first recess;

a redistribution layer electrically connected to the signal pad region and extending into the shallow recess structure;

a wire having a first end and a second end, wherein the first end is disposed in the shallow recess structure and electrically connected to the redistribution layer, and the second end is used for external electrical connection, wherein the first end of the wire is located at a bottom of the first recess, and wherein a portion of the wire is higher than the upper surface of the chip; and an encapsulant layer at least covering the wire.

* * * * *